United States Patent [19]

Suzuki et al.

[11] Patent Number: 4,972,255
[45] Date of Patent: Nov. 20, 1990

[54] COLOR LINE SENSOR HAVING PHOTODIODE ARRAYS WHICH ARE RESPECTIVELY FORMED IN DIFFERENT WELL REGIONS OF A SUBSTRATE

[75] Inventors: Toshiki Suzuki, Chiba; Yoshiharu Oowaku; Iwao Takemoto, both of Mobara, all of Japan

[73] Assignee: Hitachi, Ltd., Tokyo, Japan

[21] Appl. No.: 265,768

[22] Filed: Nov. 1, 1988

[30] Foreign Application Priority Data

Nov. 6, 1987 [JP] Japan .................. 62-279179

[51] Int. Cl.⁵ .............................. H04N 1/46
[52] U.S. Cl. .................. 358/75; 358/213.15; 358/213.18; 358/482
[58] Field of Search ............. 358/75, 213.15, 213.18, 358/482

[56] References Cited

U.S. PATENT DOCUMENTS 4,763,189  8/1988  Komatsu et al. ................ 358/75

Primary Examiner—Howard W. Britton
Attorney, Agent, or Firm—Antonelli, Terry, Stout & Kraus

[57] ABSTRACT

A monolithic color line sensor having a plurality of photoelectric converter arrays, such as three photoelectric converter arrays, each one thereof being associated with respective color filters corresponding to one of the primary colors red, green and blue. The photoelectric arrays are formed in respectively different well regions of the semiconductor substrate and which well regions are, furthermore, formed as laterally elongated well regions along a common lateral direction and which well regions are also respectively spaced-apart from each other along a vertical direction which is orthogonal to said lateral direction with respect to a common plane. The monolithic color line sensor is further associated with a read-out operation for time-serially outputting the signals from the photoelectric converters via corresponding pixel signal lines.

12 Claims, 4 Drawing Sheets

COLOR LINE SENSOR HAVING PHOTODIODE ARRAYS WHICH ARE RESPECTIVELY FORMED IN DIFFERENT WELL REGIONS OF A SUBSTRATE

FIELD OF THE INVENTION

The present invention relates to color line sensors, and more particularly to a technique advantageously applicable to color line sensors for color copiers.

BACKGROUND OF THE INVENTION

An example of known color one-dimensional or line sensors is the one published under 1-232 in the general conference 1985 of the Institute of Electronics and Communication Engineers of Japan. Such line sensor assembly comprises three line sensors encapsulated together, and a glass cap having a red (R), green (G) and blue (B) color filters provided thereon.

The above-mentioned color line sensor assembly has a serious problem in that the three line sensors are disposed side by side and each is associated with a corresponding one of red, green and blue color sensors, and thus the pitch in the longitudinal direction must be relatively large, resulting in a rather poor resolution. Besides, since the device includes three line sensors, an assembling process is required in the course of manufacturing it. Thus, the device is not suitable for mass production and necessitates high cost for production. Further, since the three line sensors must operate synchronously, a complicated driver circuit must be provided for them. There is moreover an additional problem in that the dispersion in the characteristics of the three line sensors can be immediately reflected in the output signal.

It has been conceived that a color line sensor be formed in a single semiconductor integrated circuit chip of the so-called monolithic integrated circuit type which is to be distinguished from one of a hybrid integrated circuit type in which a plurality of active and passive elements are formed on an insulating printed circuit substrate. Such an arrangement allows to achieve a high resolution since it allows to highly compactly arrange the component photoelectric converters.

As a result of their efforts into the study of color line sensors in connection with a single IC chip, the present inventors have determined that the highly compact arrangement of the photoelectric converters causes the following problem: Specifically, the photoelectric converters are formed within a well region formed in the semiconductor substrate in order to improve the spectral sensitivity and to prevent the admixture of excess electric charge. Usually, the well region is electrically isolated from the substate by a PN junction formed with adjacent semiconductor material of the substrate of a different conductivity type therefrom. When a picture element signal is read out from a line (color), crosstalk can appear in the other lines from the read out signal as a result of coupling therebetween via the well region, deteriorating the signal-to-noise (S/N) ratio.

SUMMARY OF THE INVENTION

An object of the present invention is therefore to provide a color line sensor in a single semiconductor integrated circuit chip which achieves a high resolution as well as a high S/N ratio.

In accordance with the present invention, three independent laterally elongated well regions are formed side by side with a vertical spacing therebetween (i.e. they are respectively spaced-apart along an othogonal direction with respect to a common plane), each of said well regions having an array of photoelectric converters provided therein and associated with a corresponding one of red, green and blue color filters.

Such arrangement ensures that the well regions are electrically separated from one another, and that the separation will prevent crosstalk and therefore will ensure a high S/N ratio.

BRIEF DESCRIPTION OF THE DRAWINGS

The foregoing and other objects and novel features of the present invention will be apparent from the description and the accompanying drawings, in which.

DESCRIPTION OF THE PREFERRED EMBODIMENTS

FIRST EMBODIMENT

Figure 1:
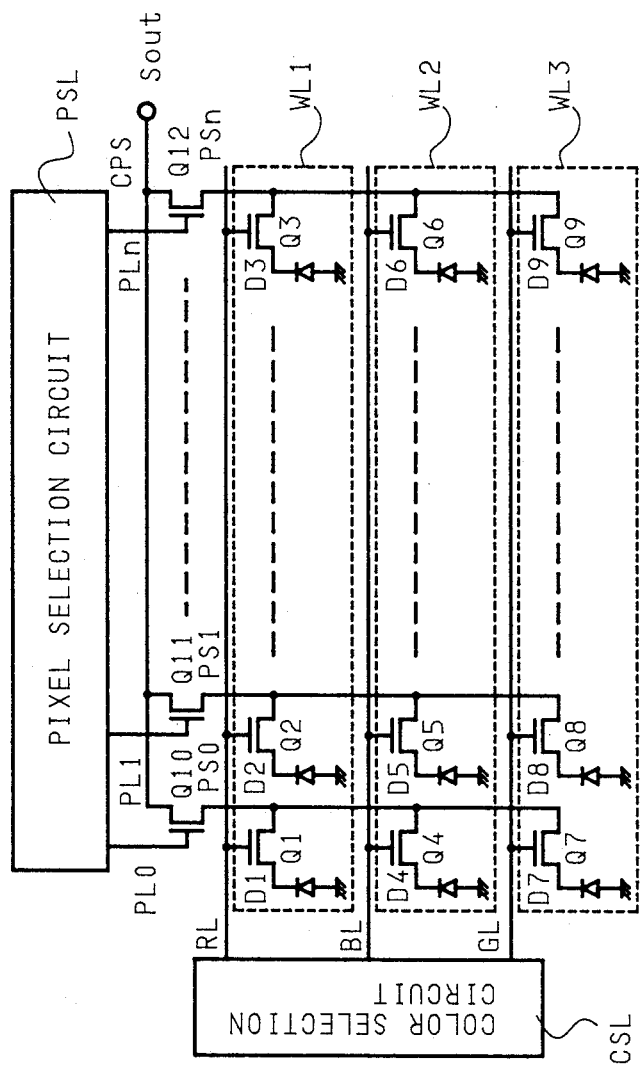
FIG. 1 is a circuit diagram showing the principal part of an embodiment of the color line sensor according to the present invention.

FIG. 1 shows the principal circuit portion of an embodiment of the color line sensor according to the present invention. The circuit elements and circuit blocks shown in this figure may be formed on a single substrate of a suitable semiconductor such as, for example, a single-crystalline (monocrystalline) silicone produced in accordance with known semiconductive-integrated-circuit manufacturing techniques.

The embodiment comprises three laterally extending linear arrays or lines of photoelectric converters (photodiodes) D1–D3, D4–D6 and D7–D9. The three arrays each extend laterally and are placed side by side.

To construct a color line sensor, the embodiment has a red, blue and green color filters (not shown) associated with corresponding arrays of the photoelectric converters. The reason why the color filters are disposed as described above is that the spectrum of light emitted from an artificial light source such as, for example, tungsten-filament lamp, is generally such that the blue component is weaker than the red and green components, and it is therefore preferable to place the blue filter in the middle so that the relative weakness can be compensated for by means of the focusing characteristics of a lens which is used to focus the light from the artificial light source upon the color line sensor. Specifically, since the lens will form a spot of light which is the brightest at the center, a compensation can be achieved for the blue component of light from an artificial light source. This gives an even sensitivity to each of the red, blue and green components.

To achieve a high resolution, the photodiodes D1–D3 of the first array are respectively connected to pixel signal lines PS0–PSn via switching MOSFETs (insulated-gate field effect transistor) Q1–Q3. The gates of the MOSFETs Q1–Q3 are connected to a common red-selecting line RL since, as described before, the red filter extends laterally. The photodiodes D4–D6 of the second array are respectively connected to the above-described vertically extending pixel signal lines PSO-PSn via switching MOSFETs Q4-A6. These switching MOSFETs Q4-Q6 have their gates connected to a common blue-selecting line BL since, as described above, the blue filter BF extends laterally. The photodiodes D7-D9 of the third array are respectively connected to the vertically extending pixel signal lines PSO-PSn via switching MOSFETs Q7-Q9. The switching MOSFETs Q7-Q9 have their gates connected to a common green-selecting line GL since, as described above, the green filter GF extends laterally. A color selecting circuit CSL time-serially produces color selecting signals which are provided to the red-selecting line RL, blue-selecting line BL and green-selecting line GL.

In this embodiment, a color signal is produced from each photodiode array as described above. Each array of the photodiodes is formed in an independent well region WL1, WL2 and WL3 shown by broken lines in FIG. 1, in order that, when a red signal, for example, is read out, crosstalk can be prevented from appearing in non-selected blue or green arrays. Each of the photodiode areas associated with the respective well regions forms a PN junction with the adjacent semiconductor material which is of a different conductivity type therefrom. In this embodiment, the groups of the switching MOSFETs (Q1-Q3), (Q4-Q6) and (Q7-Q9) corresponding to the groups of the photodiodes (D1-D3), (D4-D6) and (D7-D9), respectively, are formed in the well regions WL1, WL2 and WL3, respectively. Thus, when the first array, for example, which is associated with the red color filter, is read out, the read out signal will not cause crosstalk to appear in the non-selected photodiodes of the second and third arrays which form blue and green color signals.

Alternatively, the well regions WL1, WL2 and WL3 may be formed with relatively large spacings between them. Then, the switching MOSFETs may be formed on the semiconductor substrate between the well regions. Also in such an arrangement, the read out signal will not cause crosstalk to appear in the photodiodes of the non-selected arrays, since the well regions having the photodiodes formed therein are electrically separated from the substrate regions where the switching MOSFETs are formed.

The pixel signal lines PSO-PSn are selectively coupled to a laterally extending common signal line CPS via switching MOSFETs Q10-Q12. The common signal line CPS will output a read out signal Sout. The switching MOSFETs Q10-Q12 have their gates connected to pixel selecting line PLO-PLn. A pixel selecting circuit PSL will time-serially produce pixel selecting signals which are provided to the pixel selecting lines PLO-PLn.

The pixel selecting circuit PSL may comprise dynamic shift registers, for example, but the details thereof which are not necessary for an understanding of the color line sensor and pixel selecting circuit described herein are not shown. The color selecting circuit CSL may be a circuit which is similar to the above circuit using dynamic shift registers and which receives reading clock pulses so as to read out the photodiodes. The color selecting circuit CSL, however, is one which sequentially produces three color-selecting signals, one signal at one time, and thus it may be arranged to receive color designating signals from the outside so as to drive the color selecting lines.

In the above-described arrangement, photodiodes for producing color pixel signals are formed in a single semiconductor integrated circuit, and the thus produced color signals are taken out through MOSFETs. Therefore, since the photodiode arrays are formed in a single semiconductor integrated circuit, although in separate well regions, the pitch may be set to a small value. Thus, a high-resolution color picture signal can be achieved. Further, since each photodiode array is formed in an independent or separate well region, as described above, the read out signal from one selected array will not cause crosstalk to appear in the photodiodes of the other non-selected arrays. A high-S/N color pixel signal can therefore be achieved. Further, since signals are taken out through switching MOSFETs, it is possible to have the color selecting circuit CSL or the pixel selecting circuit PSL operate with a single power supply of about 5 volts. Therefore, the above-mentioned reading clock pulses and the control signals therefor may be directly obtained from a TTL (transistor-transistor logic) circuit.

Figure 2:
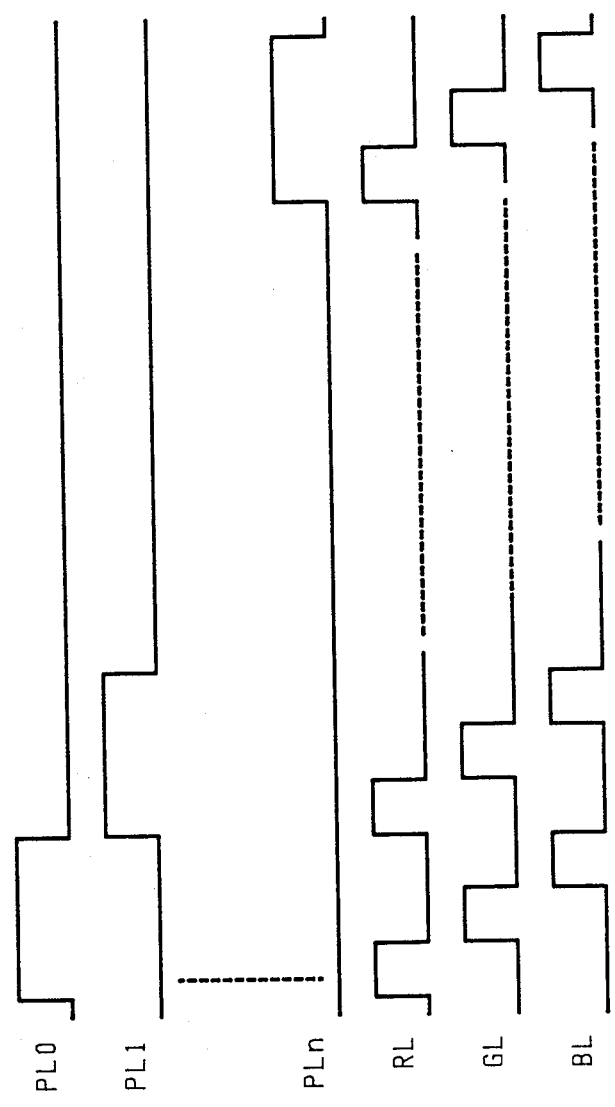
FIG. 2 is a timing chart showing an example of the reading out operation of the circuit.

FIG. 2 is a timing diagram of an example of the operation of the above-described color line sensor.

In this embodiment, a color signal is produced in the order of from "red" to "blue" and then to "green."

When the pixel signal line PS0 is selected, i.e. when the pixel selecting signal pixel PL0 is kept high and thus the switching MOSFET Q10 is rendered conductive by the pixel selecting circuit PSL, the color selecting circuit CSL will time-serially produce color selecting signals on the red selecting line RL, blue selecting line BL and green selecting line GL, in the order in which they are mentioned. Specifically, when the first signal line is selected, i.e. when the logic level of PLO is high, and in other words, when only the first signal line PSO is operatively coupled to the common signal line CPS, the logic level of the red selecting line RL is firstly turned high and thus the switching MOSFETs Q1-Q3 are turned on, with the result that the signal from the photodiode D1 is read out as the output signal Sout. Next, the red selecting line RL is turned low and at the same time the blue selecting line is turned high, and as a result the switch MOSFETs Q4-Q6 are turned on and, since only the signal line PSO is then operatively coupled to the common signal line CPS, the signal from the photodiode D4 is then read out as the output signal Sout. Lastly, the blue selecting line BL is turned low and at the same time the green selecting line GL is turned on and as a result the switching MOSFETs Q7-Q9 are turned on and, since only the signal line PSO is then operatively coupled to the common signal line CPS, the signal from the photodiode D7 is then read out as the output signal Sout.

Upon completion of the reading out of the red, blue and green color signals corresponding to one pixel, the pixel selecting circuit PSL will turn the first pixel selecting line PLO low and at the same time will turn the next pixel selecting line PL1 high, or in other words will select the next line PL1. The switching MOSFET Q11 is turned on by the high-level pixel selecting signal PL1, and as result the second signal line PS1 is operatively coupled to the common signal line CPS. When such signal line PS1 is selected, the color selecting circuit CSL will time-serially produce the color selecting signals on the red selecting line RL, blue selecting line BL and green selecting line GL, in the order in which they are mentioned. The color pixel signals comprising the second pixel signal line's R, G and B are thus time-serially outputted. The above-described selection operation will be continued to the n'th line pixel signals.

In accordance with such a reading out system, the three primary color signals corresponding to one color pixel are time-serially outputted, and thus such signals can be conveniently synthesized to obtain a color pixel.

In place of the above-described reading out sequence, another alternative sequence may be used. In accordance with such alternative sequence, the pixel selecting lines PL0-PLn are time-serially turned high so as to read out the red signal while the red selecting line RL is kept at the high level. Next, the red selecting line RL is turned low and the blue selecting line BL is turned high, and the pixel selecting lines PL0-PLn are time-serially turned high so as to read out the blue signal. Lastly, the blue selecting line BL is turned low and the green selecting line GL is turned high and the pixel selecting lines PL0-PLn are time-serially turned high so as to read out the green signal. Such reading out system is suitable for an arrangement, such as electrostatic color printers, in which an electrostatic head and a developing device are laterally moved to repeat electrification, development and fixation for each color.

The order in which colors are outputted may be arbitrarily determined in accordance with the order in which the color selecting circuit CSL will output the selecting signals.

When an artificial light source is used in this embodiment, as described previously, the blue filter is placed in the center of the three pixel arrays arranged side by side. The light from such light source will be converged by a lens to form a spot of light which is brighter at the center than at the periphery. In other words, the spot of light projected onto the light receiving portion of the above-described line sensor is such that the brightness is the highest at the center and becomes lower as it is observed at more distant position from the center. Thus, the blue photoelectric converters positioned at the center will receive a higher luminous flux than the red or green photoelectric converters placed at peripheral positions. Since an even sensitivity to red, blue and green can therefore be achieved, and since crosstalk can be prevented by the above-described arrangement wherein reading out is made from the photodiode arrays placed in separate well regions, a highly clear three-primary-color signal can be achieved. In other words, a color signal having a high S/N ratio can be achieved.

SECOND EMBODIMENT

Figure 3:
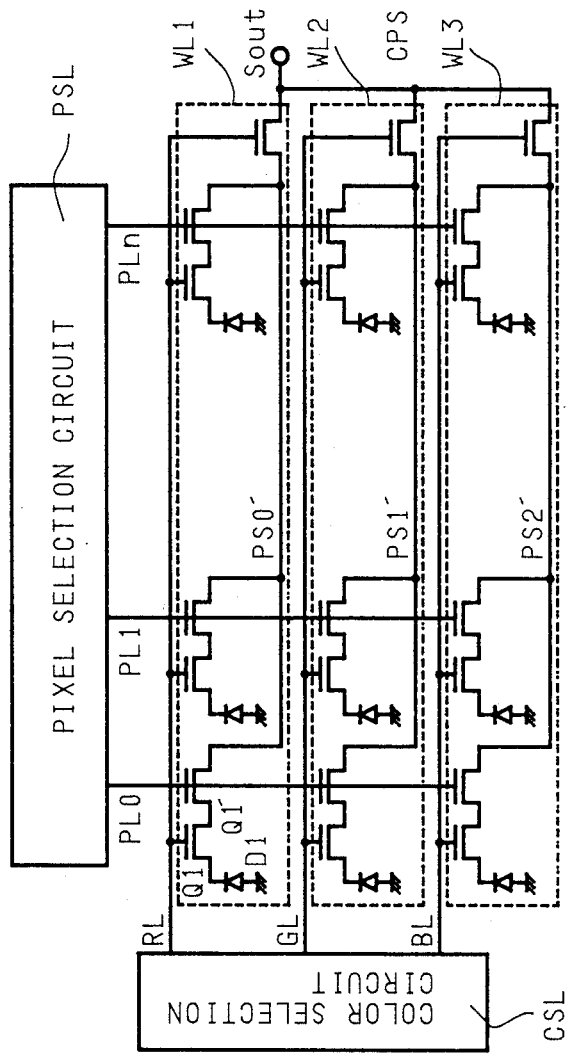
FIG. 3 is a circuit diagram showing the principal part of another embodiment of the color line sensor according to the present invention.

FIG. 3 shows the principal part of the circuit of another embodiment of color line sensor according to the present invention. In this embodiment, each photodiode is associated with two MOSFETs. Specifically, for example, a photodiode D1 is associated with a switching MOSFET Q1 having its gate connected to a red selecting line RL similar to the one described above, and with another switching MOSFET Q1' having its gate connected to a pixel selecting line PL0. The signal passing through these switching MOSFETs Q1 and Q1' is coupled to a laterally extending pixel signal line PS0'. Specifically, the photodiode arrays are associated with pixel signal lines PS0', PS1' and PS2' corresponding to red (R), green (G) and blue (B). Therefore, the pixel signal lines PS0', PS1' and PS2' are pixel lines which correspond to the colors R, G and B, respectively. Red, green and blue color filters are provided on the first, second and third photodiode arrays, respectively.

The pixel signal lines PS0', PS1' and PS2' are connected to a common signal line CPS via switching MOSFETs having their gates connected to the color selecting lines R1, G1 and B1. In this embodiment, the common signal line CPS extends vertically since the pixel signal lines PS0', PS1' and PS2' extends laterally.

In this embodiment, as in the previously described one, each photodiode array is provided in an independent well region WL1, WL2 or WL3. The selection operation is performed such that: one photodiode is selected in accordance with the corresponding combination of switching MOSFETs being turned on by the color selecting signals and pixel selecting signals produced by the color selecting circuit CSL and pixel selecting circuit PSL, respectively. Therefore, it is possible to produce a color signal for each color pixel by time-serially turning on the color selecting lines while one pixel line is kept at the high level, as shown in FIG. 2. It is also possible to produce an output signal comprising time-serially produced R, G and B component signals by time-serially turning on the pixel selecting lines while one color selecting line is kept at the high level.

THIRD EMBODIMENT

Figure 4:
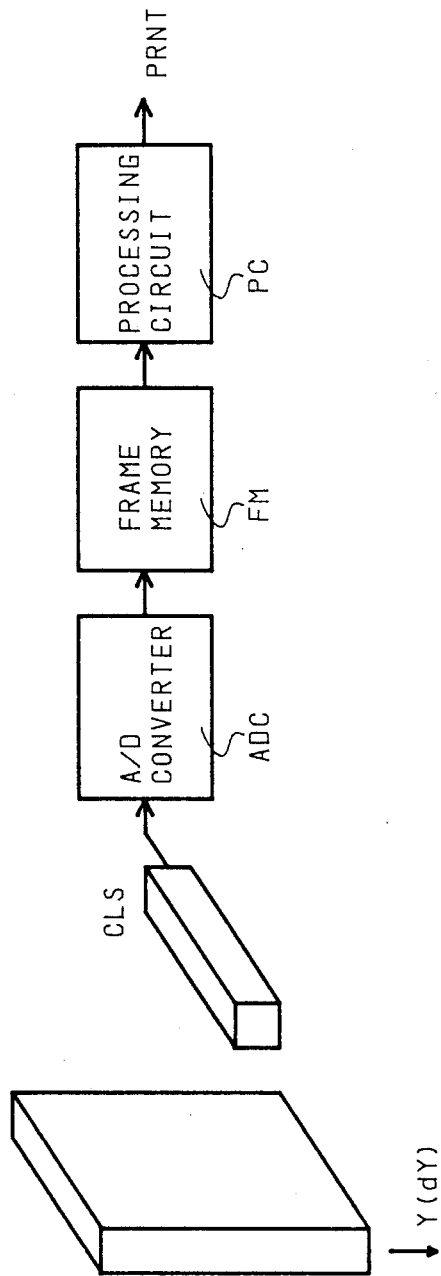
FIG. 4 is an embodiment of a color copier in which the color line sensor according to the present invention is used.

FIG. 4 is a block diagram showing an embodiment of a color copier using the color line sensor.

The output signal from the above-described color line sensor CLS is applied to an analog-to-digital (A/D) converter ADC. The output signal from the A/D converter is applied to a frame memory FM. The frame memory is arranged to have a storage capacity sufficient to store therein an amount of color pixel signal corresponding to one picture image of the subject to be copied. The storage capacity of the frame memory FM may be reduced when it is used in a high-speed color printer. For example, if the reading out time required for one line or array of the color line sensor CLS is equal to the printing time, then it is sufficient for the memory to have a capacity for storage of 2 lines. Specifically, the read out signal from the color line sensor CLS is written onto one half of the storage area, which area has a total capacity for storage of 2 lines, while the color pixel data stored in the other half of the storage area is used for a color printing operation.

The color pixel signal stored in the frame memory FM is provided to a signal processing circuit PC, where the signal is processed in accordance with the printing system of the color printer. The color printing system may be, for example, the sublimation type, electrostatic type, or ink jet type.

In this embodiment, the color line sensor CLS may be arranged to output a signal comprising time-serially produced color component signals. Since three R, G and B color filters (or color photodiode arrays) are provided side by side and vertically spaced apart, the subject to be copied is moved by a short distance (dY) for the time period from the completion of time serial read out of the red (R) signal, for example, until the initiation of the read out of the green (G) signal. This is true also in the case of the read out of the blue (B) performed after the read out of the green (G). Thus, a higher color resolution can be achieved by providing a mechanism which moves the subject to be copied by a short distance (dY) when a color signal is to be read out.

The effects achievable by the above embodiments are as follows:

(1) An array of photoelectric converters, associated with a red, green or blue color filter, is provided in an independent well region, said color filters being laterally elongated and disposed side by side with a vertical spacing between them. Thus, the well regions are electrically separated from one another, whereby crosstalk coupling between different color signals can be prevented and as a result a high S/N ratio can be achieved.

(2) In view of the fact that the light from an artificial light source is generally such that the blue components is weaker than the red and green components, the blue filter is positioned in the middle between the other two filters, red and green, in order that the relative weakness of the blue component can be compensated for by a lens mechanism which converges the light from the artificial light source onto the light receiving portion of the line sensor so as to form a spot of light which is the brightest at the center where the blue filter is positioned. This, in combination with the above effect (1), makes it possible to achieve a highly clear (high S/N) color picture signal.

(3) A plurality of photoelectric converters are provided in combination with laterally elongated color filters disposed side by side, the photoelectric conversion signals produced by the photoelectric converters are time-serially outputted through switching elements which receive the selecting signals produced by the pixel selecting/scanning circuit and color selecting circuit, whereby the pitch between the photoelectric converter arrays for producing the color signals can be set to a small value and thus a high-resolution color picture signal can be achieved.

(4) Since, in accordance with the above (2), the signals from the photoelectric converters are outputted through switching MOSFETs, the operating voltage 5 volts may be provided by a single power supply. Thus, since the device may be directly driven by TTL level signals, it is possible as a result thereof to simplify and miniaturize the device.

The present inventors made by the inventor has thus been described in detail with reference to the accompanying drawings. The invention however is not limited to the particular embodiments described and shown, and clearly various modifications or changes may be made therein without departing from the spirit of the invention. For example, the embodiments shown and described include switching MOSFETs as the means for reading out the signals from the photoelectric converters associated with the color filters RF, BF and GF disposed side by side, but a CCD (charge coupled device) shift register may alternatively be used as such means. Then, vertical resolution might be slightly deteriorated, since the CCD register must be placed between the arrays or lines of pixels. Nevertheless, it is possible to achieve a resolution which is significantly higher than that which is achievable by the previously described prior art comprising an assembly of three individual semiconductor chips which constitute individual line sensors.

The present invention is widely applicable to color line sensors.

What is claimed is:

1. A monolithic color line sensor comprising:
   a monocrystalline semiconductor substrate;
   first to third laterally elongated well regions being formed in said semiconductor substrate along a common lateral direction and being respectively spaced-apart from each other along a vertical direction which is orthogonal to said lateral direction with respect to a common plane; and
   first to third photo-diode arrays each being comprised of a plurality of photodiodes arrayed in the lateral direction, each being formed within a respective one of said first to third well regions and being associated with first to third colors, respectively.

2. A monolithic color line sensor disposed along a common lateral direction comprising:
   a semiconductor substrate;
   a plurality of color filters each one thereof being associated with a different one of a plurality of colors;
   a plurality of laterally elongated well regions being formed in said substrate along said common lateral direction and being respectively spaced-apart from each other along a vertical direction which is orthogonal to said lateral direction with respect to a common plane; and
   a plurality of photoelectric converting element arrays each being comprised of a plurality of photoelectric converting elements arrayed in the lateral direction, each converting element array being formed within a corresponding one of said well regions and being associated with a respective one of said plurality of colors.

3. A color line sensor comprising:
   a set of color filters each color filter thereof being associated with a respectively different one of a plurality of colors;
   a monocrystalline semiconductor substrate;
   a set of elongated well regions being respectively formed in said semiconductor substrate along a common lateral direction and being respectively spaced-apart from each other along a vertical direction which is orthogonal to said lateral direction with respect to a common plane; and
   a set of photodiode arrays each being comprised of a plurality of photodiodes arrayed in the lateral direction, wherein each one of said photodiode arrays is formed within a correspondingly different one of said well regions and is associated with a respectively different one of said plurality of colors.

4. A color line sensor according to claim 3, wherein each one of said photodiode arrays includes a plurality of photodiodes respectively disposed in said lateral direction in a corresponding one of said well regions.

5. A color line sensor according to claim 4, wherein each one of said photodiode arrays includes a plurality of photodiodes respectively coupled with a corresponding one of a plurality of switching elements, and wherein both said plurality of photodiodes array are disposed in a corresponding one of said well regions.

6. A color line sensor according to claim 5, wherein each respective color of said plurality of colors corresponds to one of primary colors.

7. A color line sensor according to claim 5, wherein said plurality of photodiode arrays are correspondingly associated with a color filter of one of red, green and blue, respectively.

8. A color line sensor according to claim 5, wherein in each one of said plurality of photodiode arrays, each one of said plurality of photodiodes together with a correspondingly coupled switching element comprises a photodiode cell associated with a color pixel, and wherein the corresponding photodiode cells associated with each photodiode array are disposed in a corresponding well region as a single row of photodiode cells.

9. A color line sensor according to claim 8, wherein each respective color of said plurality of colors corresponds to one of primary colors.

10. A color line sensor according to claim 8, wherein each one of said plurality of photodiode arrays is correspondingly associated with a different one of color filters associated with the color red, green and blue.

11. A color line sensor according to claim 10, wherein each switching element is comprised of a single MOSFET having a source-to-drain current path series-coupled with a respective photodiode between a reference potential and a respective one of a plurality of pixel signal lines, said pixel signal lines being respectively disposed along said vertical direction and being respectively coupled for effecting read-out of a photodiode cell from each one of said plurality of photodiode arrays associated with the same pixel upon the corresponding MOSFETs being turned ON.

12. A color line sensor according to claim 10, wherein each switching element is comprised of a pair of MOSFETs series-connected along the respective source-to-drain current paths thereof and wherein said pair of MOSFETs are series-coupled with a respective photodiode between a reference potential and a respective one of a plurality of pixel signal lines, each one of said plurality of pixel signal lines is respectively disposed along said lateral direction and is coupled for effecting read-out of a photodiode cell of a corresponding photodiode array which is associated with only one of the primary colors red, green and blue.

* * * * *